(12) United States Patent
Fornara et al.

(10) Patent No.: US 11,322,503 B2
(45) Date of Patent: May 3, 2022

(54) INTEGRATED CIRCUIT INCLUDING AT LEAST ONE MEMORY CELL WITH AN ANTIFUSE DEVICE

(71) Applicant: STMicroelectronics (Rousset) SAS, Rousset (FR)

(72) Inventors: Pascal Fornara, Pourrieres (FR); Fabrice Marinet, Chateauneuf le Rouge (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 17/141,498

(22) Filed: Jan. 5, 2021

(65) Prior Publication Data

US 2021/0126000 A1    Apr. 29, 2021

Related U.S. Application Data

(63) Continuation of application No. 16/546,002, filed on Aug. 20, 2019, now Pat. No. 10,923,484.

(30) Foreign Application Priority Data

Aug. 31, 2018    (FR) ...................................... 1857840

(51) Int. Cl.
*G11C 17/16*     (2006.01)
*H01L 27/112*    (2006.01)
*H01L 23/58*     (2006.01)
*H01L 23/528*    (2006.01)
(Continued)

(52) U.S. Cl.
CPC ........ *H01L 27/11206* (2013.01); *G11C 17/16* (2013.01); *G11C 17/18* (2013.01);
(Continued)

(58) Field of Classification Search
CPC .......... H01L 27/11206; H01L 23/5226; H01L 23/5252; H01L 23/528; H01L 23/585;
(Continued)

(56) References Cited

U.S. PATENT DOCUMENTS 5,299,151 A    3/1994 Ishihara et al.
5,442,589 A *  8/1995 Kowalski ............... G06K 19/07
                                        257/E23.149
(Continued)

FOREIGN PATENT DOCUMENTS

TW         201126535 A    8/2011

OTHER PUBLICATIONS

INPI Search Report and Written Opinion for FR 1857840 dated Jul. 8, 2019 (9 pages).

*Primary Examiner* — Khamdan N. Alrobaie
(74) *Attorney, Agent, or Firm* — Crowe & Dunlevy

(57) ABSTRACT

An integrated circuit includes a memory cell incorporating an antifuse device. The antifuse device includes a state transistor having a control gate and a second gate that is configured to be floating. A dielectric layer between the control gate and the second gate is selectively blown in order to confer a broken-down state on the antifuse device where the second gate is electrically coupled to the control gate for storing a first logic state. Otherwise, the antifuse device is in a non-broken-down state for storing a second logic state.

16 Claims, 7 Drawing Sheets

(51) Int. Cl.
  *G11C 17/18* (2006.01)
  *H01L 23/525* (2006.01)
  *H01L 23/522* (2006.01)

(52) U.S. Cl.
  CPC ........ *H01L 23/528* (2013.01); *H01L 23/5226* (2013.01); *H01L 23/5252* (2013.01); *H01L 23/585* (2013.01)

(58) Field of Classification Search
  CPC ........... H01L 27/1128; H01L 27/11293; H01L 27/1124; G11C 17/16; G11C 17/18; G11C 7/24
  See application file for complete search history.

(56) References Cited

U.S. PATENT DOCUMENTS

| | | | |
|---|---|---|---|
| 6,903,436 | B1 | 6/2005 | Luo et al. |
| 7,982,245 | B2 | 7/2011 | Lim et al. |
| 8,953,404 | B2 * | 2/2015 | Kanda .................. G11C 17/16 365/225.7 |
| 8,982,648 | B2 * | 3/2015 | Onuma .................. G11C 17/18 365/189.16 |
| 2005/0007855 | A1 | 1/2005 | Lee et al. |
| 2005/0072990 | A1 | 4/2005 | Terashima |
| 2006/0267669 | A1 | 11/2006 | Robinson et al. |
| 2008/0049485 | A1 | 2/2008 | Matsufuji et al. |
| 2010/0165775 | A1 | 7/2010 | Obayashi et al. |
| 2010/0214008 | A1 | 8/2010 | Li et al. |
| 2011/0176381 | A1 | 7/2011 | Wang et al. |
| 2015/0294979 | A1 | 10/2015 | Choi et al. |
| 2016/0300843 | A1 | 10/2016 | Jung |
| 2017/0372790 | A1 | 12/2017 | Jeong et al. |
| 2018/0005703 | A1 | 1/2018 | Chung |
| 2018/0040376 | A1 | 2/2018 | Delalleau |
| 2018/0166382 | A1 | 6/2018 | Lee |
| 2020/0075611 | A1 | 3/2020 | Fornara et al. |
| 2020/0203359 | A1 * | 6/2020 | Wang ................ H01L 27/11573 |

* cited by examiner

INTEGRATED CIRCUIT INCLUDING AT LEAST ONE MEMORY CELL WITH AN ANTIFUSE DEVICE

CROSS REFERENCE TO RELATED APPLICATIONS

This application is a continuation of U.S. patent application Ser. No. 16/546,002 filed Aug. 20, 2019, which claims the priority benefit of French Application for Patent No. 1857840, filed on Aug. 31, 2018, the contents of which are hereby incorporated by reference in their entireties to the maximum extent allowable by law.

TECHNICAL FIELD

Embodiments relate to integrated circuits, in particular to integrated antifuse devices and more particularly to the protection of integrated circuits from reverse engineering, for example to the protection of memory-storage integrated circuits from attacks by probing.

BACKGROUND

Integrated circuits, in particular those provided with memories containing sensitive information, have to be protected to the greatest possible extent from reverse-engineering operations, in particular from those intended to uncover stored data.

The stored data may, for example, be binary information, and be stored on antifuse devices including two terminals, which may be in a broken-down (or on) state, to represent a first binary value, or in a non-broken-down (or off) state, to represent a second binary value of the data.

A possible attack may be carried out after thinning the integrated circuit so as to get as close as possible to the antifuse devices in order to measure the resistance between the two terminals of the antifuse device and, in this way, to learn their states.

There are solutions allowing an operation of thinning the integrated circuit to be detected, and the stored data to be made unreadable in the event of a thinning operation having taken place.

Although these solutions are effective, they may, in some cases, be complex to implement or bypassed.

There is a need to produce an antifuse device structure which is technologically simple and which, when it is used in particular in a memory cell, allows facilitated reading.

SUMMARY

According to one embodiment, what is proposed is a new antifuse device structure which may in particular be used for data storage and which is complex to analyze in the context of a reverse-engineering operation, most particularly in the context of a memory module having a matrix architecture.

According to one aspect, what is proposed is an integrated circuit including at least one memory cell comprising an antifuse device including a state transistor having a control gate and a second gate that is configured to be floating so as to confer a non-broken-down state on the antifuse device or to be electrically coupled to the control gate so as to confer a broken-down state on the antifuse device.

Incorporating an antifuse device into a double-gate state transistor structure (a structure having a control gate and a floating gate) is technologically straightforward since this embodiment uses existing double-gate state transistor structures and simply requires that the dielectric layer between the two gates be broken down or not broken down.

Furthermore, combining an antifuse device with a MOS transistor advantageously allows the state of the antifuse device to be read by biasing the transistor, and hence the formation of a contact on the second gate to be avoided. Thus, it is not possible for an attacker to measure the electrical resistance between the two gates for the purpose of learning the state of the antifuse device.

The state transistor may include at least a first polysilicon region and a second polysilicon region separated by a layer of dielectric material, the second gate including the first polysilicon region and the control gate including the second polysilicon region, the broken-down state of the antifuse device resulting in an electrical connection between the first polysilicon region and the second polysilicon region through the layer of dielectric material.

The integrated circuit may comprise an electrically conductive connecting element including a first end that is electrically coupled to the second gate and a second, free end that is located outside the integrated circuit.

The integrated circuit may include a sealing ring including metal tracks and vias extending around the entire periphery of the integrated circuit, the connecting element including a crossing part which crosses said sealing ring, the second end being located outside the sealing ring.

This sealing ring advantageously allows the integrated circuit to be protected in particular during a cutting step.

According to one embodiment, the integrated circuit includes a semiconductor well, the bottom of which is delimited by a buried semiconductor region and including an insulated vertical electrode extending from the upper face of the well down to a region close to the bottom of the well, a heavily n-doped region providing electrical continuity between the vertical electrode and the buried semiconductor layer, said vertical electrode comprising said first polysilicon region and forms the second gate, the state transistor being a vertical transistor.

The memory cells may advantageously be interconnected according to a matrix architecture, each memory cell including an access transistor which is coupled between the MOS transistor and a read line which is common to all of the cells.

For a memory cell to be read, it is then necessary for the access transistor of said memory cell to be on and the other access transistors of the line to be kept in an off state so as to avoid parasitic currents propagating over the read line and falsifying the result.

An attacker will therefore have to use a distinct probe for each access transistor of the line, which makes the read operation very complex or even impossible when the matrix includes a substantial number of columns, for example more than 10 or so columns.

A plurality of memory cells may share one and the same first polysilicon region.

According to one aspect, what is proposed is a semiconductor wafer including first zones including integrated circuits such as defined above, which first zones are separated from one another by second zones including cutting lines, wherein the second end of the connecting element of at least one integrated circuit is located in a second zone such that the integrated circuit and the second end are located on either side of the corresponding cutting line.

It is thus possible to program the memory cells before the step of cutting through the integrated circuit, via the connecting element. During the cutting operation, the connecting element is severed, leaving the first polysilicon region unconnected to a fixed potential.

According to one aspect, what is proposed is a method for programming at least one memory cell including an antifuse device such as defined above, comprising an operation of forming an electrical connection between the control gate and the second gate so as to have said broken-down state, or an operation of placing the second gate in the floating state so as to have said non-broken-down state.

The operation of programming said at least one memory cell may include an operation of setting the potential of the second gate to a first reference potential via a connecting element, the application or otherwise of a second reference potential so as to place said antifuse device in a broken-down or non-broken-down state, respectively, and an operation of cutting through said connecting element in such a way that its second end is free.

According to one aspect, what is proposed is a method for reading at least one memory cell of an integrated circuit such as defined above, wherein the control gate of the state transistor is biased and the drain current of the state transistor is read, a drain current that is below a threshold being read indicating a non-broken-down state of the antifuse device and a drain current that is above said threshold being read indicating a broken-down state of the antifuse device.

According to another aspect, what is proposed is a chip card incorporating an integrated circuit such as defined above.

BRIEF DESCRIPTION OF THE DRAWINGS

Other advantages and features of the invention will become apparent upon examining the detailed description of completely non-limiting implementations and embodiments of the invention and the appended drawings, in which.

DETAILED DESCRIPTION

Figure 1:
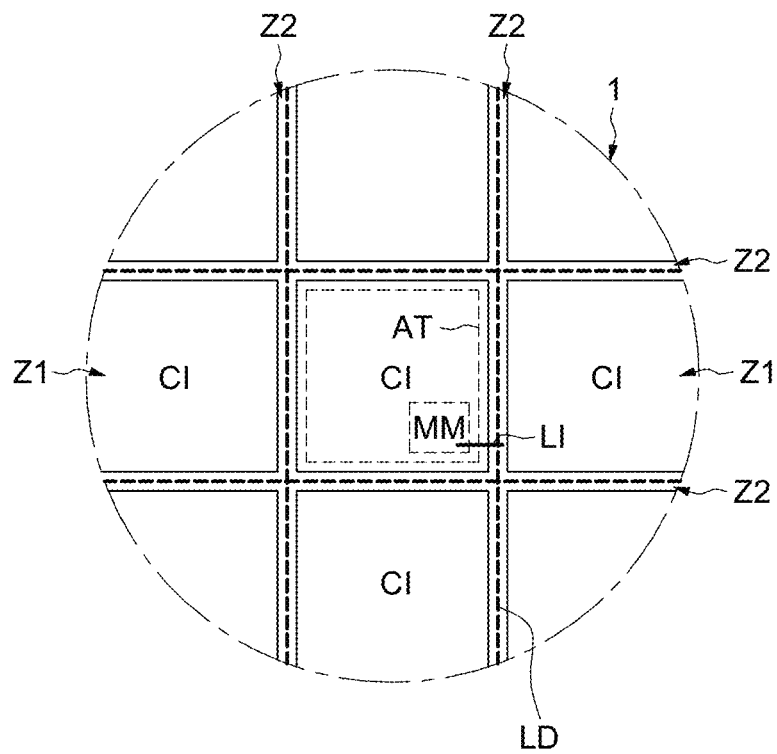
FIG. 1 is a top view of a semiconductor wafer.

FIG. 1 shows a view from above of a semiconductor wafer 1, for example made of silicon.

The wafer 1 includes first zones Z1 containing integrated circuits CI, and second zones Z2 separating the first zones Z1 and containing cutting paths LD along which the wafer 1 will be cut so as to singulate the integrated circuits CI.

The operation of cutting through the semiconductor wafer may be performed conventionally using a specific circular saw with a diamond blade and/or using a cutting laser. This operation is conventional and known per se.

Each integrated circuit CI includes a memory module MM including a plurality of memory cells.

A sealing ring AT located at the periphery of the integrated circuit advantageously allows the integrated circuit CI to be protected from the potential propagation of chips, splinters or any other impurity during the operation of cutting through the wafer 1.

This sealing ring AT also forms a barrier against the penetration of moisture into the interconnect part of the integrated circuit (also known as the BEOL, for back end of line, relating to interconnection metallization layers), which is particularly advantageous when this interconnect part includes insulating regions having a low dielectric constant (low-K material).

It would be entirely possible for the integrated circuits CI to comprise a plurality of sealing rings, so as to improve the sealtightness of the integrated circuits CI still further.

Each integrated circuit CI includes at least one connecting element LI extending from the memory module MM to out of the integrated circuit CI and into the second zone Z2 and further beyond the cutting line. Each connecting element LI includes a crossing part which crosses the sealing ring without electrically coupling therewith, and a straddling part which straddles the cutting line. The cutting operation therefore severs the connecting element LI.

Figure 2:
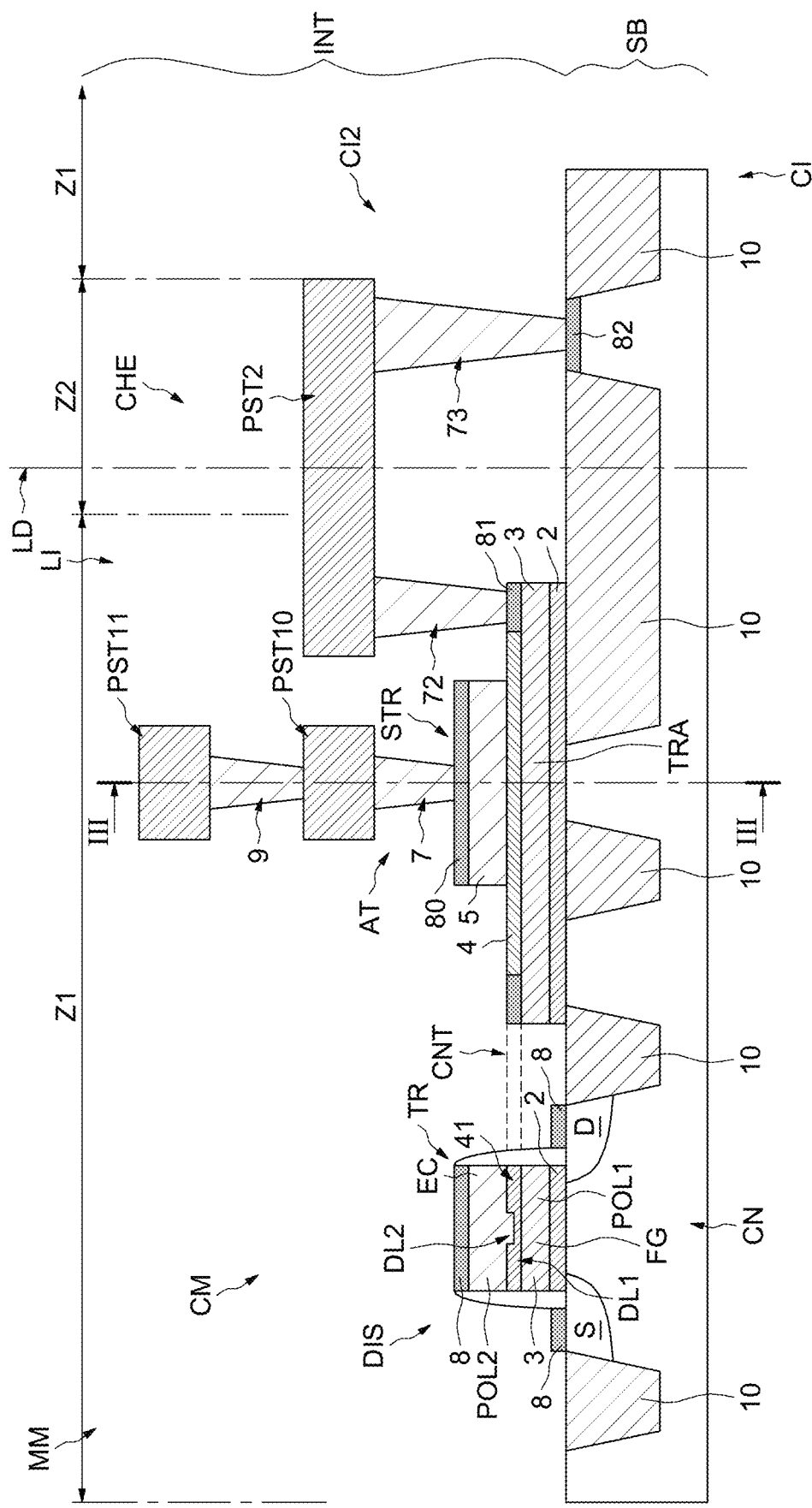
FIG. 2 is a schematic sectional view of an integrated circuit.

FIG. 2 is a schematic sectional view of an integrated circuit CI. The integrated circuit CI is produced in and on the semiconductor substrate SB, for example here a p-doped substrate, which is itself surmounted by an interconnect part INT (which includes premetallization layer region and a plurality of metallization levels). The substrate S may be divided into a plurality of wells CN by isolating regions 10, for example shallow trench isolations (STIs), or by local oxidation of the silicon (LOCOS).

FIG. 2 shows in particular a portion of the first zone Z1 of the integrated circuit including a memory cell CM of the memory module, the sealing ring AT and a portion of the connecting element LI which is produced to further extend into the second zone Z2, adjacent to the first zone Z1.

The sealing ring AT comprises a first contact 7 forming a wall, for example made of tungsten, and a succession of superposed metal tracks and vias associated with the metallization levels.

For the sake of simplicity, only first metal tracks PST10 and PST11, which are located on the first and second metallization levels, and a via 9 forming a wall, which is located between these two first tracks PST10 and PST11, are shown. In practice, the sealing ring AT will be able to comprise as many vias and metal tracks as necessary, according to the desired height of the sealing ring.

Figure 3:
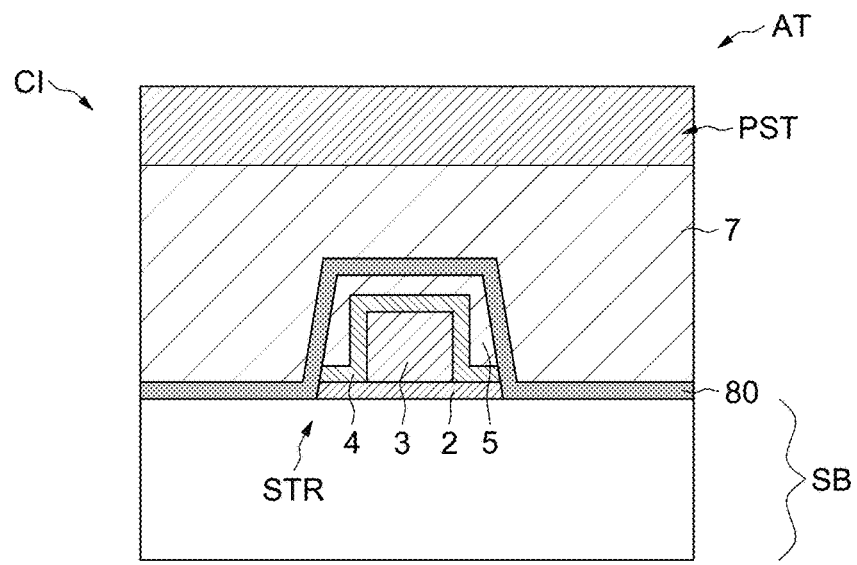
FIG. 3 is a sectional view of FIG. 2.

The sealing ring AT is produced on a stacked structure STR, or lower part of the sealing ring, which is produced directly on the substrate SB, and of which FIG. 3 is a sectional view along the cutting line of FIG. 2.

The structure STR includes:

a first polysilicon bar 3 produced on a first dielectric layer 2 and covered with a second dielectric layer 4, for example layers 2 and 4 made of silicon oxide or an oxide-nitride-oxide alloy layer, known to those skilled in the art by the acronym ONO. Thus, the bar 3 is enveloped in a dielectric material;

a second polysilicon bar 5 covering the dielectric layer 4 over part of its length; and a metal silicide layer 80 covering the second polysilicon bar 5 over its entire length.

In the example described here, the structure STR includes two polysilicon bars 3 and 5. This results from the use, for the production of the structure STR, of a fabrication step corresponding normally to steps for fabricating floating-gate transistors at other sites on the integrated circuit, as will be seen below. Specifically, the production of a floating gate includes the production of a stack of two polysilicon bars separated by an insulating layer.

Adapting the floating-gate fabrication process for the fabrication of the structure STR is therefore particularly advantageous and economical since it makes it possible to avoid carrying out a specific fabrication step for the structure STR.

That being said, the structure STR of said sealing ring AT could include just a single polysilicon bar, for example the first polysilicon bar 3 insulated from the substrate S by a dielectric layer, for example the second dielectric layer 2. In this case, the contact 7 would be produced directly on the dielectric layer 4, which layer alone would insulate the first bar 3 from the sealing ring AT.

This structure STR, which forms the lower part of the sealing ring, includes the crossing part TRA of the connecting element. This crossing part, formed here from the polysilicon bar 3, is electrically insulated from the substrate SB and from the rest of the sealing ring by the second layer 4 of dielectric material and by the second polysilicon bar.

The straddling part CHE of the connecting element LI includes here:
- a second metal contact 72, here a tungsten contact, making contact with the polysilicon bar 3 via a first silicided region 81;
- a second metal track PST2 which is coupled to the second metal contact 72 formed in the first metal level and extending from the first zone Z1 into the second zone Z2 beyond the cutting line LD; and
- a third tungsten metal contact 73 which is coupled both to the second metal track PST2 and to the substrate SB via a second silicided region 82.

The memory module MM has here a capacity of 1 kilobit (i.e., it includes 1024 binary memory cells), wherein each memory cell is capable of containing one item of binary information. A single memory cell CM is shown here for the sake of simplicity.

The memory cell CM includes an element allowing the binary information to be stored, which is here an antifuse device DIS, and an access transistor, which is not shown in FIG. 2 for the sake of simplicity, allowing said information to be read.

In general, the antifuse device includes a state transistor TR having a control gate EC, a second gate FG separated from the control gate EC by a dielectric layer 41, and another dielectric layer 2 separating the second gate FG from the subjacent well CN.

The antifuse device therefore has the structure of a double-gate state transistor, the second gate of which, as will be seen in greater detail below, will be able to be floating or electrically connected to the control gate EC according to the broken-down or not-broken-down state of the antifuse device.

The transistor TR includes a first polysilicon region POL1, here part of the first polysilicon bar 3, and a second polysilicon region POL2, here part of the second polysilicon bar 5, which is separated from the first polysilicon region POL1 by the dielectric layer 41, which is part of the second insulating layer 4.

Thus, the second polysilicon region POL2 forms the control gate EC of the MOS transistor and the first polysilicon region POL1 forms the second gate FG of the MOS transistor TR.

Contacts (not shown) are formed on source S and drain D regions and on the control electrode EC via silicided regions 8.

Continuations of material CNT between the first polysilicon bar 3 and the first polysilicon region POL1 and between the second dielectric layer 4 and the part 41, that are not located in the plane of FIG. 2 are shown here by dashed lines.

The part 41 of the second dielectric layer 4 located below the control electrode comprises a first portion DL1 having a first thickness for example between 100 Å and 200 Å here and a second portion DL2, which is thinned with respect to the rest of the dielectric layer DL, having a thickness of between 15 Å and 30 Å. The rest of the second dielectric layer 4 has the first thickness.

The antifuse device is configured to break down when the voltage between the first polysilicon region POL1 and the second polysilicon region POL2 is higher than a breakdown voltage of the antifuse device DIS, for example here about 5 volts.

When this voltage is exceeded, an electrical path is formed at the site of the thinned portion DL2 between the first polysilicon region POL1 and the second polysilicon region POL2.

It would be possible for all of part 41 of the second dielectric layer 4 to have the second thickness. That being said, the presence of a defined thinned portion makes it possible to have better control over the breakdown voltage.

Figure 4:
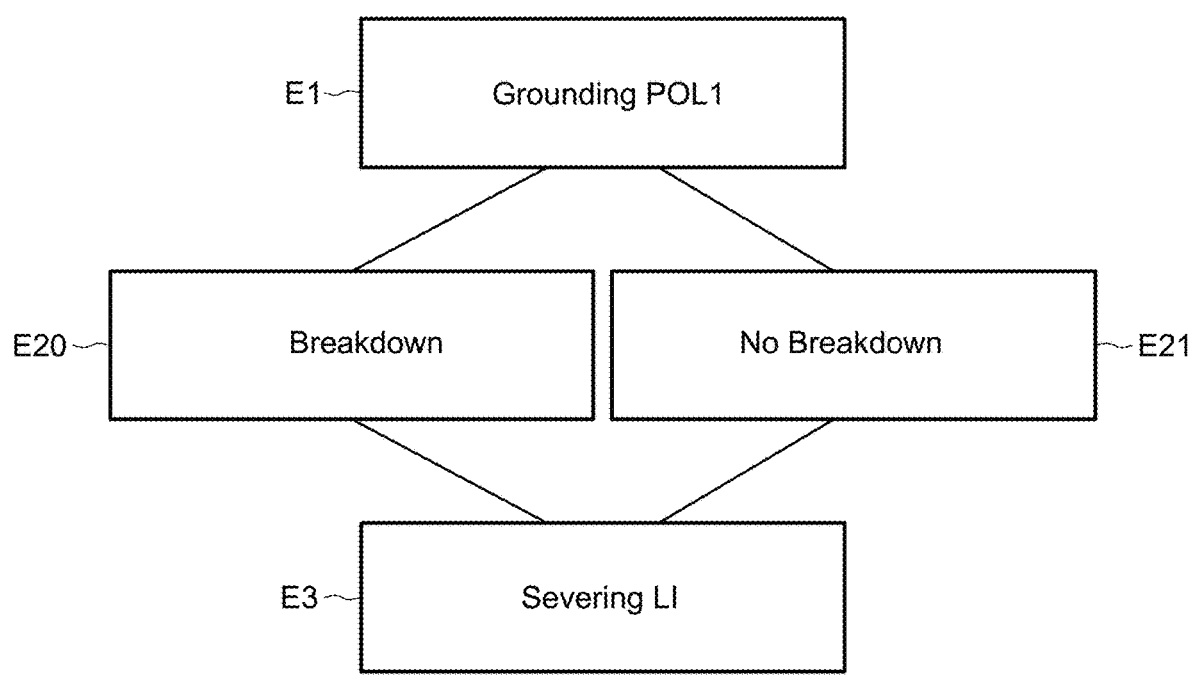
FIG. 4 illustrates steps of a programming method.

It is thus possible to program the memory module MM by breaking down or not breaking down to the antifuse device of each memory cell CM. FIG. 4 illustrates the programming method.

Breakdown is achieved by applying a reference potential, here ground potential, to the first polysilicon region POL1 via the connecting element LI (step E1), and by applying a potential to the second polysilicon region POL2 so as to obtain a voltage of more than 5 volts between the first polysilicon region POL1 and the second polysilicon region POL2 (step E20).

To not break down the antifuse device DIS, it is enough not to bias the second polysilicon region POL2, or to bias it such that the voltage between the polysilicon regions is lower than the breakdown voltage (step E21).

The second potential may be applied to the second polysilicon regions POL2 by a bias circuit inside the integrated circuit CI.

Since all of the connecting elements LI of the integrated circuit CI that are connected to the second gates of the antifuse device are here coupled to the substrate SB, it is possible to couple the substrate SB to ground so as to apply the ground potential to all of the first polysilicon regions POL1 of the memory cells.

It would also be possible for the first polysilicon regions to be coupled to one another by the continuation of polysilicon material, and electrically coupled to one or more common connecting elements.

Figure 5:
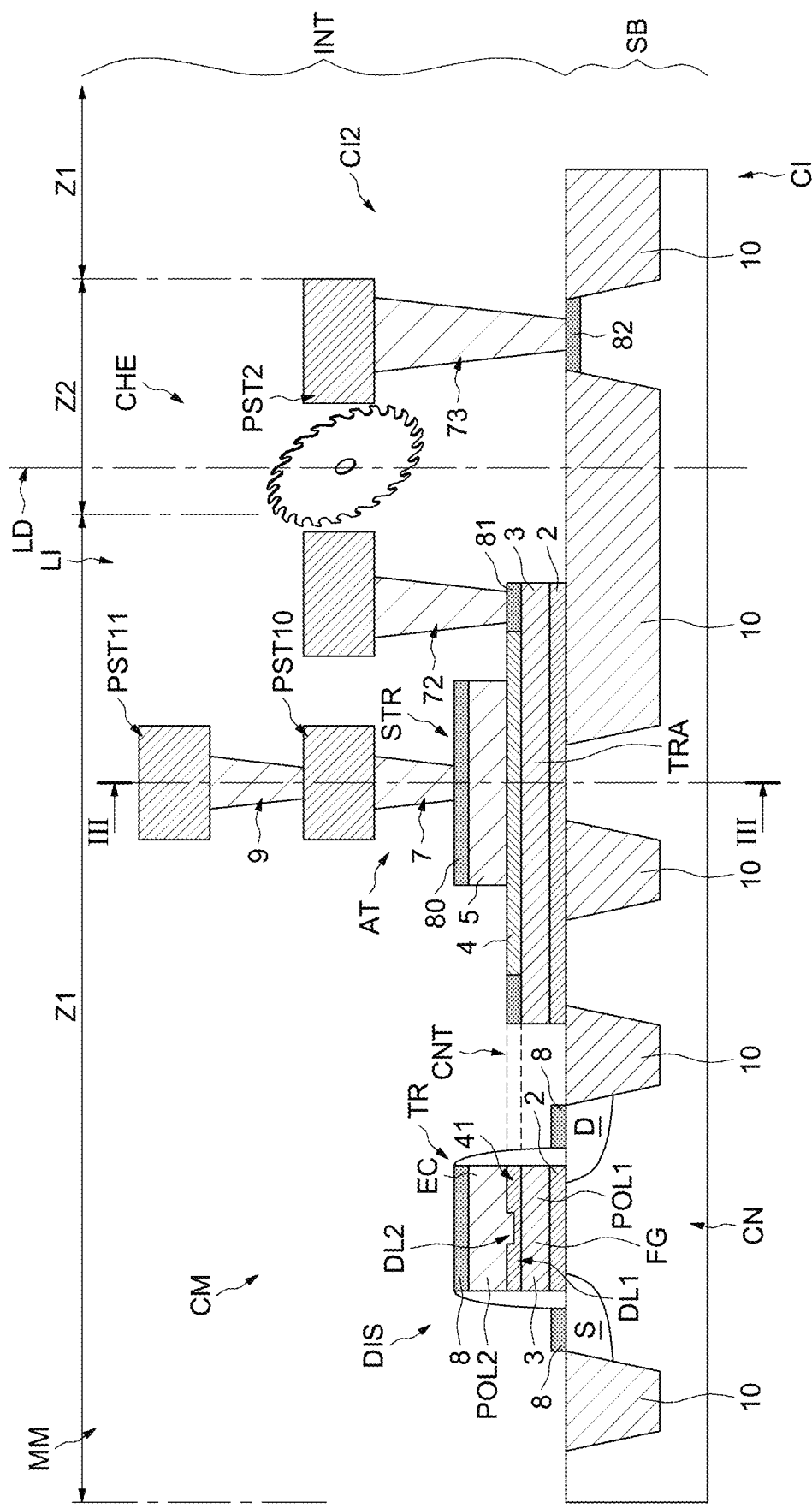
FIG. 5 illustrates a singulation step.

Once programming has been carried out, each integrated circuit CI is, as illustrated in FIG. 5, singulated in a cutting step using a saw SC along the cutting lines LD (step E3 of FIG. 4). The connecting elements LI are therefore severed at the peripheral edge of the circuit and the first polysilicon regions POL1 are no longer connected to a fixed potential (and hence form a floating node) since the second ends of the connecting elements are free. Their charge is here very low since the first polysilicon regions were coupled to ground prior to cutting. It would also be possible to cut the stack of the two polysilicon bars 3 and 5 of the structure STR outside the sealing ring AT, for example between the sealing ring AT and the second metal contact 72, so as to make potential contact with this floating node at the site of the cut at the peripheral edge of the circuit through the diced integrated circuit CI even more difficult to achieve.

If the antifuse device DIS is not broken down, the biasing of the substrate of the transistor TR, i.e. the region in which the channel is formed, will take place through the part 41 of the insulating layer 4, the second gate FG, and the gate oxide 2. In this case, the threshold voltage of the MOS transistor will not be reached and the MOS transistor will remain in an off state.

If the antifuse device DIS is broken down, then the control gate EC and the second gate FG are electrically coupled to one another. The two polysilicon regions POL1 and POL2 form one and the same gate and the biasing of the substrate of the transistor TR takes place through the gate oxide only.

In this case, the threshold voltage of the MOS transistor will be reached and the MOS transistor will be in an on state.

Figure 6:
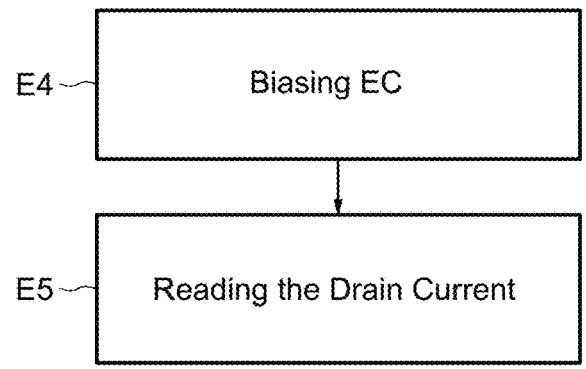
FIG. 6 illustrates an operation of reading the information contained in the memory cell.

The operation of reading the information contained in the memory cell CM, illustrated by FIG. 6, is performed by biasing the control gate EC at a determined read voltage, for example here 2 volts (step E4) and by reading the drain current of the MOS transistor TR via the access transistor (step E5).

If the antifuse device DIS is not broken down, then the bias voltage is lower than the threshold voltage of the transistor TR, and the drain current will be zero or very small and more generally below a threshold. The absence of a drain current during reading is therefore an indication of a first binary value of the information contained in the memory cell CM.

If the antifuse device DIS is broken down, then the bias voltage is higher than the threshold voltage of the transistor TR, and the drain current will be nonzero and more generally above said threshold. The presence of a drain current during reading is therefore an indication of a second binary value of the information contained in the memory cell CM.

By way of indication, the value of the current threshold is of the order of 1 to 50 μA, and preferably of the order of 1 to 10 μA.

Figure 7:
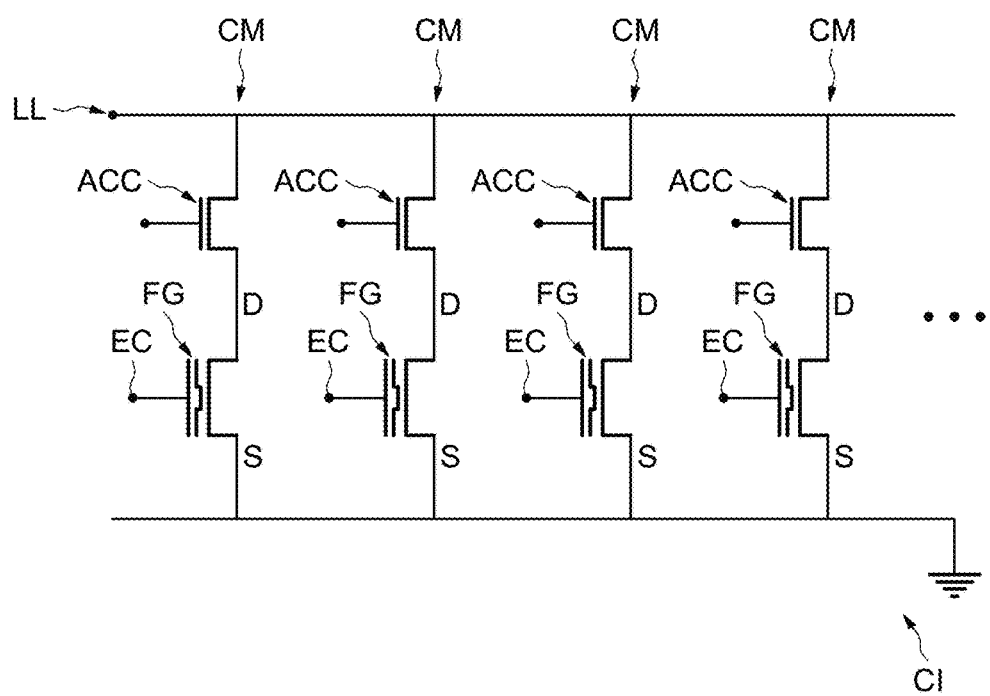
FIG. 7 is a partial schematic illustration from an electrical point of view of a line of a matrix.

The binary memory cells CM of the memory module MM may advantageously be organized according to a matrix architecture. FIG. 7 is a partial schematic illustration from an electrical point of view of a line of such a matrix.

In practice, the matrix may include 16 lines and 64 columns of memory cells.

Each transistor TR of each memory cell CM is here coupled in series with an access transistor ACC between a ground line and a read line LL.

When reading the information contained in a memory cell CMi, it is necessary to apply the bias voltage to the corresponding control gate EC, to bias the access transistor so as to turn it on, and to read the drain current flowing over the read line LL (bit line).

It is also necessary to bias the access transistors of the other memory cells CM so as to keep them in an off state, in order to avoid parasitic currents on the read line which would falsify the read operation.

When analyzing the integrated circuit CI in the context of a reverse-engineering operation, it is then very complicated to read one cell.

Specifically, an attacker would here need a first probe for biasing the control gate, a second probe for biasing the access transistor ACC, and a number of probes equal to the number of remaining cells on the line in order to keep the other access transistors in the off state.

For example here, for a matrix of 64 columns, 66 probes would be needed, which in practice makes reading impossible in the context of a reverse-engineering operation.

The attacker would not be able to measure the resistance between the control gate EC and the second gate FG either, since the floating gate FG has no contact on which the attacker could place a probe.

The circuit is therefore reliably protected from reverse engineering.

Figure 8:
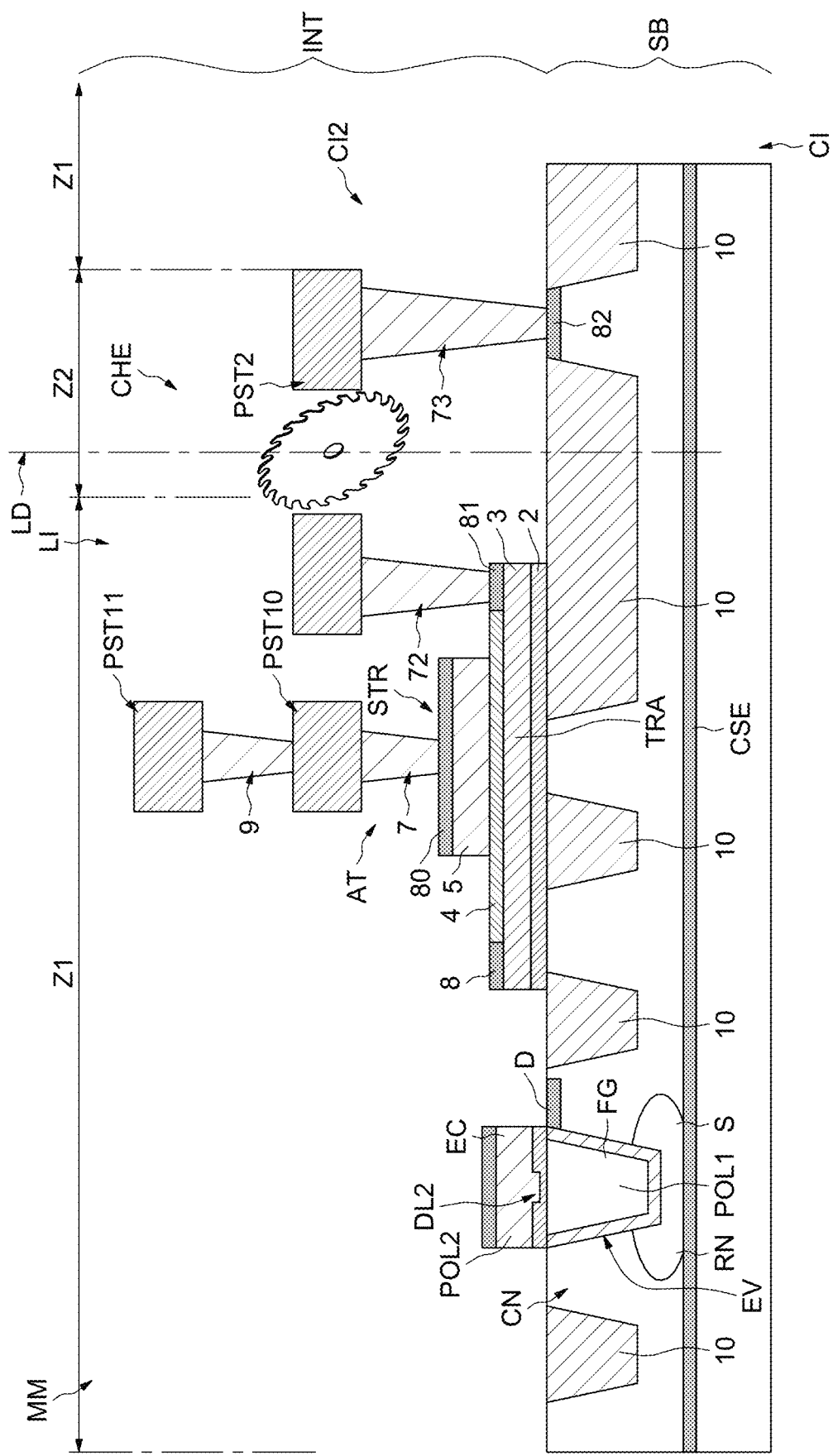
FIG. 8 illustrates an alternative embodiment using a vertical transistor.

According to one alternative embodiment illustrated in FIG. 8, it would be possible for the transistor TR to be a vertical transistor.

In this case, the well CN includes a vertical electrode EV extending from the front face of the well down to a region close to the bottom of the well, including an insulating wall, for example made of silicon oxide, and a polysilicon filling forming the first polysilicon region POL1 and surmounted by the part 41 of the second insulating layer 4 on which the second polysilicon region POL2 is produced.

The bottom of the well CN is here delimited by a heavily n-doped buried semiconductor layer CSE, commonly referred to by those skilled in the art by the term "NISO", and a heavily n-doped region RN is produced below the vertical electrode EV so as to provide electrical continuity between the vertical electrode EV and the NISO layer.

The drain D of the transistor TR is here formed by a heavily n-doped region level with the surface of the well CN which is juxtaposed with the vertical electrode EV, and the source region S is here formed by the region RN and the NISO layer.

In FIG. 8, the continuity of material between the polysilicon bar 3 and the second gate FG is not shown for the sake of simplicity.

Figure 9:
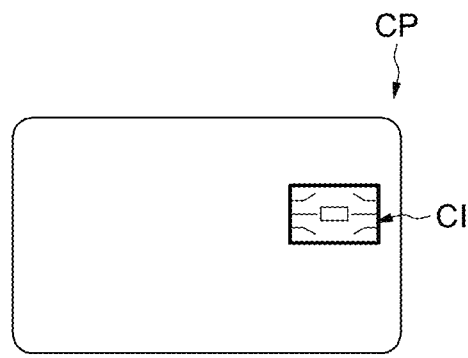
FIG. 9 illustrate a system, such as a chip card CP, which includes the integrated circuit.

The integrated circuit described above in conjunction with FIGS. 1 to 8 may be incorporated within any type of system, such as for example a chip card CP as illustrated in FIG. 9.

The invention claimed is:

1. An integrated circuit, including at least one memory cell, wherein the at least one memory cell comprises:
    a state transistor having a control gate electrode, a floating gate electrode and a layer of dielectric material positioned between the control gate electrode and the floating gate electrode; and
    wherein the layer of dielectric material includes a first portion having a first thickness and a second portion having a second thickness that is thinner than the first thickness;
    said second thickness of the second portion being configured to be broken down in response to an applied voltage at the control gate electrode so that the control gate electrode is electrically connected to the floating gate electrode.

2. The integrated circuit according to claim 1, wherein the control gate electrode is formed by a first polysilicon layer in contact with a top of the layer of dielectric material and wherein the floating gate electrode is formed by a second polysilicon layer in contact with a bottom of the layer of dielectric material.

3. The integrated circuit according to claim 1, further including an electrically conductive connecting element including a first end that is electrically coupled to the floating gate electrode and a second, free end that extends to a peripheral edge of the integrated circuit.

4. The integrated circuit according to claim 3, including a sealing ring including metal tracks and vias extending around the entire periphery of the integrated circuit, the connecting element including a crossing part which crosses said sealing ring, the second end being located between the sealing ring and the peripheral edge.

5. The integrated circuit according to claim 1, further comprising:
   a semiconductor well having a bottom that is delimited by a buried semiconductor region;
   an insulated vertical electrode in said semiconductor well extending from the upper face of the semiconductor well down to a region close to the bottom of the semiconductor well;
   a heavily n-doped region providing electrical continuity between the insulated vertical electrode and the buried semiconductor layer;
   wherein said insulated vertical electrode forms the floating gate electrode.

6. The integrated circuit according to claim 5, further including an electrically conductive connecting element including a first end that is electrically coupled to the insulated vertical electrode and a second, free end that extends to a peripheral edge of the integrated circuit.

7. The integrated circuit according to claim 6, including a sealing ring including metal tracks and vias extending around the entire periphery of the integrated circuit, the electrically conductive connecting element including a crossing part which crosses said sealing ring, the second end being located between the sealing ring and the peripheral edge.

8. The integrated circuit according to claim 5, wherein the layer of dielectric material including the first and second portions extends on the upper face of the semiconductor well.

9. The integrated circuit according to claim 1, wherein the broken down condition of the second portion of the layer of dielectric material fixes the at least one memory cell to be programmed with a first logic state.

10. The integrated circuit according to claim 9, wherein the non-broken down condition of the second portion of the layer of dielectric material fixes the at least one memory cell to be programmed with a second logic state opposite the first logic state.

11. The integrated circuit according to claim 1, wherein the integrated circuit is a component of a chip card.

12. The integrated circuit according to claim 1, further comprising means for reading said at least one memory cell by:
   biasing the control gate electrode of the state transistor; and
   reading a drain current of the state transistor, wherein a drain current that is below a threshold is indicative of a non-broken down state and wherein a drain current above said threshold is indicative of a broken down state.

13. A method for programming a memory cell including a state transistor having a control gate electrode, a floating gate electrode and a layer of dielectric material positioned between the control gate electrode and the floating gate electrode, wherein the layer of dielectric material includes a first portion having a first thickness and a second portion having a second thickness that is thinner than the first thickness, the method comprising:
   to program a first data state: applying a voltage between the control gate electrode and the floating gate electrode at a sufficient voltage level so as to cause a break down at the second portion of the layer of dielectric material so that the control gate electrode is electrically connected to the floating gate electrode; and
   wherein a second data state is provided by presence of the second portion of the layer of dielectric material to insulate the control gate electrode from the floating gate electrode.

14. The method according to claim 13, wherein the operation of programming said at least one memory cell to the first data state includes:
   setting a potential of the floating gate electrode to a first reference potential;
   applying a second reference potential to the control gate electrode.

15. The method according to claim 14, wherein the floating gate electrode is electrically connected via a connecting element to a source of the first reference potential, the method further comprising, after programming said at least one memory cell to the first data state, cutting through said connecting element in such a way that a second end of the connecting element is free.

16. The method according to claim 15, wherein the connecting element extends outside of an integrated circuit sealing ring, and wherein cutting is performed on the connecting element outside of the integrated circuit sealing ring.

* * * * *